(12) United States Patent
Morimoto et al.

(10) Patent No.: US 7,592,628 B2
(45) Date of Patent: Sep. 22, 2009

(54) DISPLAY WITH THIN FILM TRANSISTOR DEVICES HAVING DIFFERENT ELECTRICAL CHARACTERISTICS IN PIXEL AND DRIVING REGIONS

(75) Inventors: Yoshihiro Morimoto, Hsinchu (TW); Ryan Lee, Hualien (TW)

(73) Assignee: TPO Displays Corp., Chu-Nan (TW)

( * ) Notice: Subject to any disclaimer, the term of this patent is extended or adjusted under 35 U.S.C. 154(b) by 390 days.

(21) Appl. No.: 11/490,551

(22) Filed: Jul. 21, 2006

(65) Prior Publication Data

US 2008/0017937 A1    Jan. 24, 2008

(51) Int. Cl.
  *H01L 27/105* (2006.01)
(52) U.S. Cl. ............ 257/72; 257/E29.278; 257/E29.293
(58) Field of Classification Search ................. 257/72, 257/291, 411, E29.278, E29.293
See application file for complete search history.

(56) References Cited

U.S. PATENT DOCUMENTS

| 6,731,352 | B2 | 5/2004 | Shih et al. |
| 6,828,586 | B2 * | 12/2004 | Fujimoto et al. ............... 257/59 |
| 6,888,161 | B2 | 5/2005 | Shih |
| 2004/0227195 | A1 | 11/2004 | Chang et al. |
| 2004/0245549 | A1 | 12/2004 | Chang et al. |
| 2005/0074914 | A1 * | 4/2005 | Chang et al. ................... 438/48 |
| 2005/0258488 | A1 | 11/2005 | Chang et al. |

* cited by examiner

*Primary Examiner*—Jerome Jackson, Jr.
*Assistant Examiner*—Paul A Budd
(74) *Attorney, Agent, or Firm*—Liu & Liu

(57) ABSTRACT

A system for displaying images comprises a thin film transistor (TFT) device comprising first and second active layers disposed on a substrate in the driving circuit region and in the pixel region, respectively. Each active layer comprises a channel region, a source/drain region and a lightly doped region formed therebetween. Two gate structures are disposed on the first and second active layers, respectively. Each gate structure comprises a stacked first and second gate dielectric layers and a gate layer, and the second gate dielectric layer has a length shorter than that of the first gate dielectric layer but longer than the gate length of the gate layer. The lightly doped region of the first active layer has a length different from that of the second active layer.

17 Claims, 7 Drawing Sheets

DISPLAY WITH THIN FILM TRANSISTOR DEVICES HAVING DIFFERENT ELECTRICAL CHARACTERISTICS IN PIXEL AND DRIVING REGIONS

BACKGROUND OF THE INVENTION

1. Field of the Invention

The present invention relates to a flat panel display technology, and in particular to thin film transistor (TFT) devices in driving circuit and pixel regions, and a method for fabricating a system for displaying images having the TFT devices.

2. Description of the Related Art

The demand for active-matrix flat panel displays, such as active matrix liquid crystal displays (LCDs), has increased rapidly in recent years. LCDs typically employ thin film transistors (TFTs) as pixel and driving circuit switching elements which are classified as amorphous silicon (a-Si) TFTs and polysilicon TFTs according to the materials used as an active layer. Compared with a-Si TFTs, polysilicon TFTs have the advantages of high carrier mobility, high driving-circuit integration, and are often applied to high-speed operation applications. One of the major drawbacks of polysilicon TFTs is OFF-state leakage current, causing charge loss in LCDs. Seeking to address this problem, conventional lightly doped drain (LDD) structures have been used to reduce the drain junction field, thereby reducing leakage current.

FIGS. 1A to 1D illustrate a conventional method for fabricating an n-type thin film transistor device for a flat panel display (FPD). In FIG. 1A, a substrate 100 is provided. The substrate 100 comprises a driving circuit region I and a pixel region II. A buffer layer 102 is deposited on the substrate 100, which may serve as an adhesion layer or a contamination barrier layer between the substrate 100 and a subsequent active layer. First and second active layers 103 and 104 are formed on the buffer layer in the driving circuit region I and the pixel region II, respectively. The first and second active layers 103 and 104 may comprise polysilicon and may be formed by conventional low temperature polysilicon (LTPS) technology. Boron ion implantation 10 is performed on the first and second active layers 103 and 104 for channel doping.

In FIG. 1B, a masking pattern layer 106 is formed on the substrate shown in FIG. 1A, to cover portions of the first and second active layers 103 and 104, respectively, for definition of a source/drain region. Heavy-ion implantation 12 for n-type doping is performed to form source/drain regions 103a and 104a in the first and second active layers 103 and 104, respectively.

After removal of the unnecessary masking pattern layer 106, a gate dielectric layer 108 and a metal layer 110 are successively formed on the substrate shown in FIG. 1B, as shown in FIG. 1C. Next, a masking pattern layer 112 is formed on the metal layer 110 above the first and second active layers 103 and 104 for gate definition.

The metal layer 110 uncovered by the masking pattern layer 112 is etched to form gate layers 113 and 114 overlying the first and second active layers 103 and 104, as shown in FIG. 1D. Typically, the gate layers 113 and 114 do not overlap the underlying source/drain regions 103a and 104a in order to define lightly doped drain (LDD) regions in subsequent step. Thereafter, light-ion implantation 14 for n-type LDD doping is performed using the gate layers 113 and 114 as implanting masks, to form channel regions 103c and 104c (i.e. undoped regions under the gate layers 113 and 114) and lightly doped regions 103b and 104b serving as LDDs in the first and second active layers 103 and 104, completing the fabrication of the TFTs in the driving circuit region I and the pixel region II.

In the conventional thin film transistor device, the TFTs in the driving circuit region I and the pixel region II are fabricated at the same time and by the same process. Therefore, the length $d_1$ of the lightly doped region 103b is substantially equal to the length $d_2$ of the lightly doped region 104b. Typically, it is desirable to design pixel TFTs with low leakage current and driving TFTs with high electron mobility (fast response). However, it is difficult to fabricate TFTs with low leakage for a pixel region and high electron mobility for a driving circuit region because both leakage and electron mobility are inversely relative to the length of LDD. That is, the conventional thin film transistor devices cannot have TFTs with low leakage for a pixel region and high electron mobility for a driving circuit region due to LDD in both the pixel and driving circuit regions being the same length. Moreover, in a conventional thin film transistor device, lithography is employed to define the location and size of the LDD region. Thus, it is difficult to further reduce the length of the LDD to improve electron mobility due to the limitations of lithography.

Thus, there exists a need in the art for development of an improved thin film transistor device which has different TFT electrical characteristics in the driving circuit and pixel regions, thereby providing driving TFTs with high electron mobility and pixel TFTs with low leakage.

SUMMARY OF THE INVENTION

The present invention provides an overall TFT structure for the driving circuit and pixel regions, in which the TFTs in the driving region and the pixel region have different characteristics, in particular electron mobility and/or leakage characteristics. In one aspect of the present invention, the TFTs in the driving circuit and the pixel regions have active layers that are defined with lightly doped regions having different characteristic or effective lengths about the respective channel regions. The overall length of the active layer may be substantially similar and the length of the channel/gate for both regions may be substantially similar, but the lengths of the LDD regions in the two regions are different. In another aspect of the present invention, this overall TFT structure is formed by a process in which the respective lightly doped regions are not defined concurrently or simultaneously for the driving circuit and pixel regions. The masking and doping steps are staggered for the driving circuit and pixel regions, so as to obtain lightly doped regions of different lengths about the respective channel region. In particular, the masking and doping process in the pixel region applies heavy ion doping to the active layer before the LDD regions are formed, but the masking and doping process in the driver circuit region applies heavy ion doping to concurrently dope the LDD along with the source/drain regions.

In accordance with one embodiment of the present invention, first and second active layers are disposed on the substrate in the driving circuit region and in the pixel region, respectively. Each of the first and second active layers comprises a channel region, a source/drain region and a lightly doped region formed therebetween. Two gate structures are disposed on the first and second active layers, respectively. Each gate structure comprises a stacked first and second gate dielectric layers and a gate layer, and the second gate dielectric layer has a length shorter than that of the first gate dielectric layer but longer than the gate length of the gate layer. The lightly doped region of the first active layer has an effective length different from that of the second active layer.

An embodiment of a method for fabricating a system for displaying images comprises providing a substrate comprising a driving circuit region and a pixel region. A first active layer is formed on the substrate in the driving circuit region and a second active layer is formed on the substrate in the pixel region. A source/drain region is formed in the second active layer. A gate structure is formed on the first and second active layers, respectively, wherein each gate structure comprises a stacked first and second gate dielectric layers and a gate layer, and the second gate dielectric layer has a length shorter than that of the first gate dielectric layer but longer than the gate length of the gate layer. The gate layer, the second gate dielectric layer and a portion of the first gate dielectric layer on the second active layer are covered by a masking layer. Heavy-ion implantation is performed to form source/drain and lightly doped regions in the first active layer. After removal of the masking layer, light-ion implantation is performed to form a lightly doped region in the second active layer, wherein the lightly doped region of the second active layer has a length different from that of the first active layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
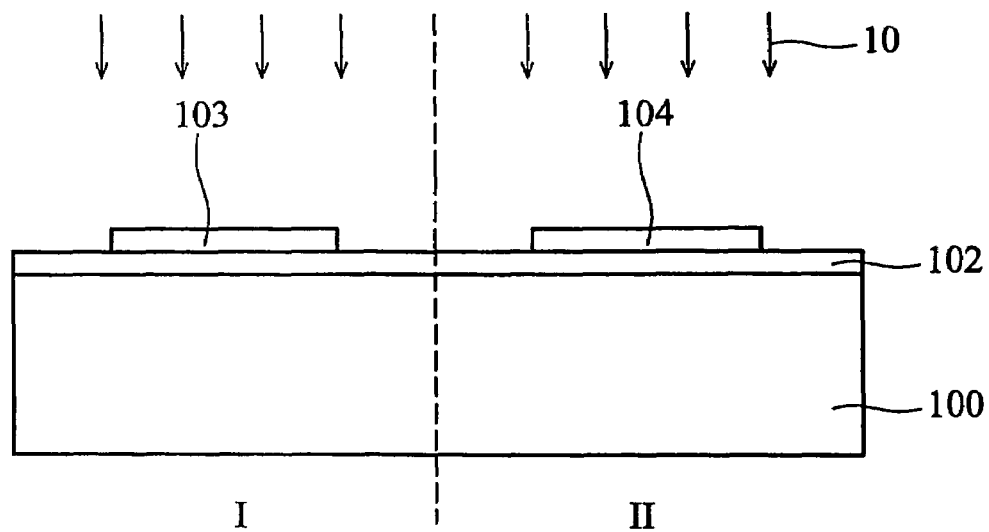
FIGS. 1A to 1D are cross-sections of a conventional method for fabricating an n-type thin film transistor device for an FPD.
Figure 1B:
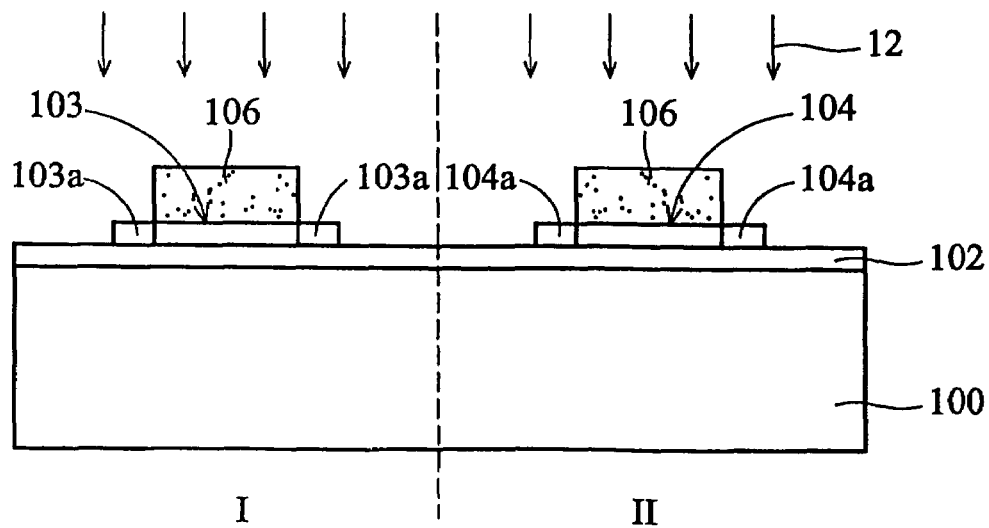
Figure 1C:
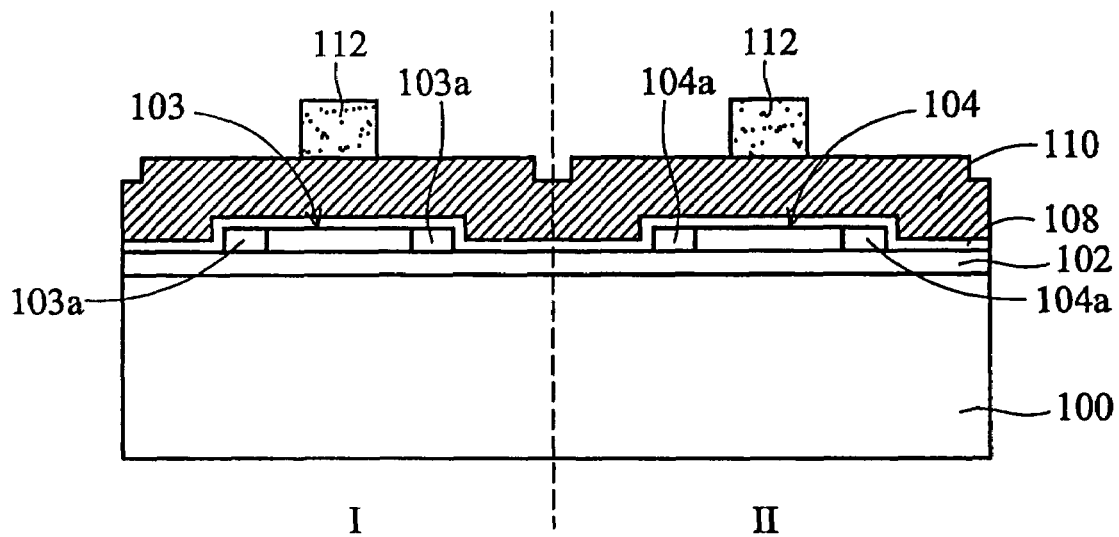
Figure 1D:
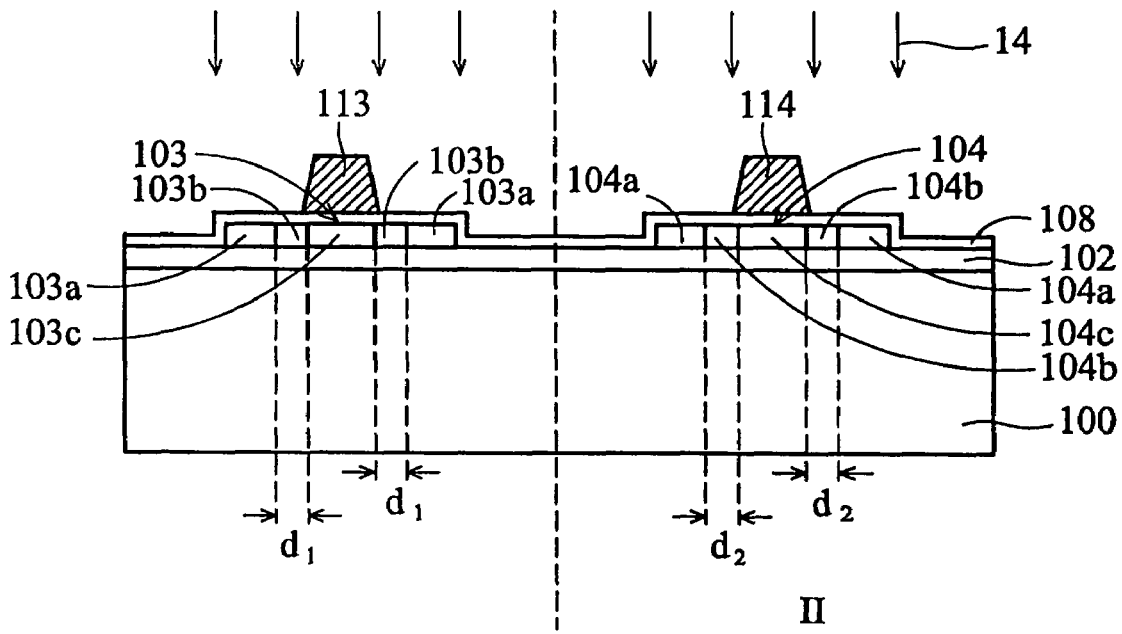

The following description is of the best-contemplated mode of carrying out the invention. This description is made for the purpose of illustrating the general principles of the invention and should not be taken in a limiting sense. The scope of the invention is best determined by reference to the appended claims.

Exemplary embodiments of systems for displaying images and fabrication methods are provided. In this regard, FIG. 2F illustrates an embodiment of the TFT device 300 in such a system. Specifically, the system incorporates a thin film transistor (TFT) device comprises a substrate 200 comprising a driving circuit region I and a pixel region II. A buffer layer 202 may be optionally disposed on the substrate 200 to serve as an adhesion layer or a contamination barrier layer between the substrate 200 and the subsequent active layer. In the illustrated embodiment, the active layers in the two regions I and II are substantially similar in length, and the channel/gate in the two regions I and II are substantially similar in length, but the LDD regions in the two regions I and II are different in length. First and second active layers 203 and 204 are disposed on the substrate 200 in the driving circuit region I and in the pixel region II, respectively. The first active layer 203 may comprise a channel region 203c, a source/drain region 203a and a lightly doped region 203b formed therebetween. The second active layer 204 may also comprise a channel region 204c, a source/drain region 204a and a lightly doped region 204b formed therebetween. Here, the term of "lightly doped region" represents a lightly doped drain (LDD) region. In this embodiment, the lightly doped region 203b of the first active layer 203 has a length $D_1$ different from the length $D_2$ of the second active layer 204. Particularly, the length $D_1$ is shorter than the length $D_2$. Two gate structures are disposed on the first and second active layers 203 and 204, respectively, thus TFTs are complete. The TFT in the driving circuit region I may comprise a CMOS or PMOS. The TFT in the pixel region II may comprise a CMOS or NMOS. The gate structure disposed on the first active layer 203 comprises a stacked first and second gate dielectric layers 208 and 211 and a gate layer 215. The gate structure disposed on the second active layer 204 also comprises a stacked first and second gate dielectric layers 208 and 213 and a gate layer 216. In this embodiment, the second gate dielectric layer 211 or 213 has a length $L_2$ shorter than the length $L_1$ of the first gate dielectric layer 208 but longer than the gate length $L_3$ of the gate layer 215 or 216, as shown in FIG. 2D.

Figure 4:
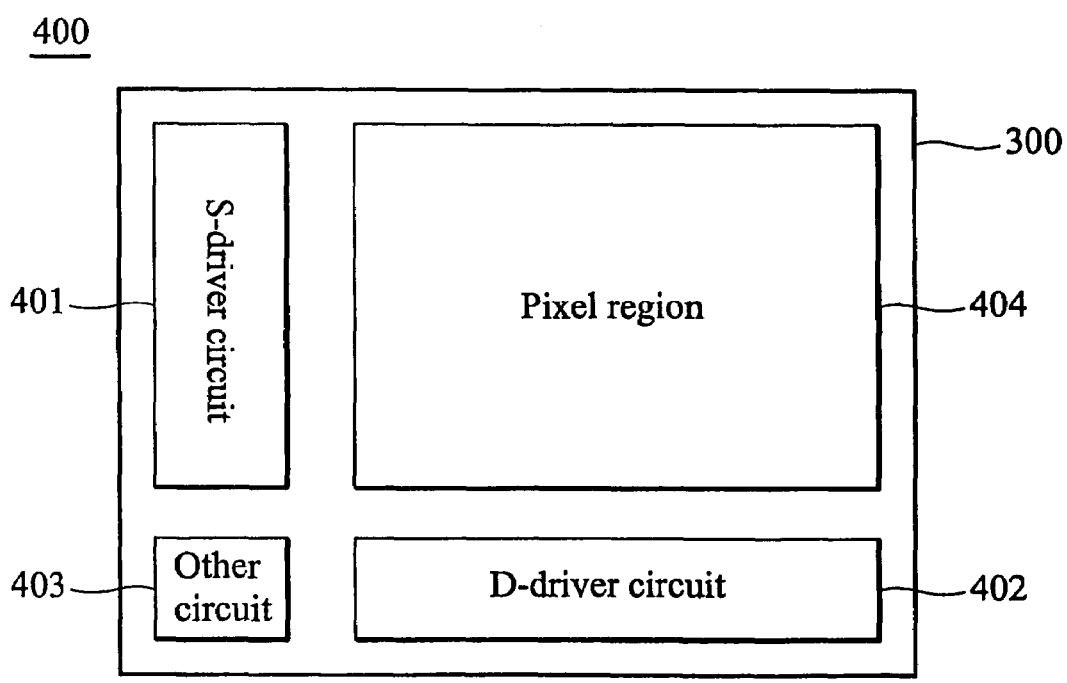
FIG. 4 is a schematic representation of a system for displaying images that incorporates the flat panel display device including the TFT device shown in FIG. 2F.

FIG. 4 is a schematic representation of a system for displaying images that incorporates the flat panel display (FPD) device 400 including the TFT device 300 shown in FIG. 2F. The FPD device 400 comprises a scan driver circuit region (S-driver circuit) 401, a data driver circuit region (D-driver circuit) 402, a timing control circuit region (other circuit) 403 and a pixel region 404, in which the TFTs formed in the driving circuit region I shown in FIG. 2F are located in the scan driver, data driver and timing control circuit regions 401, 402 and 403. Moreover, the TFTs formed in the pixel region II shown in FIG. 2F are located in the pixel region 404.

Figure 2A:
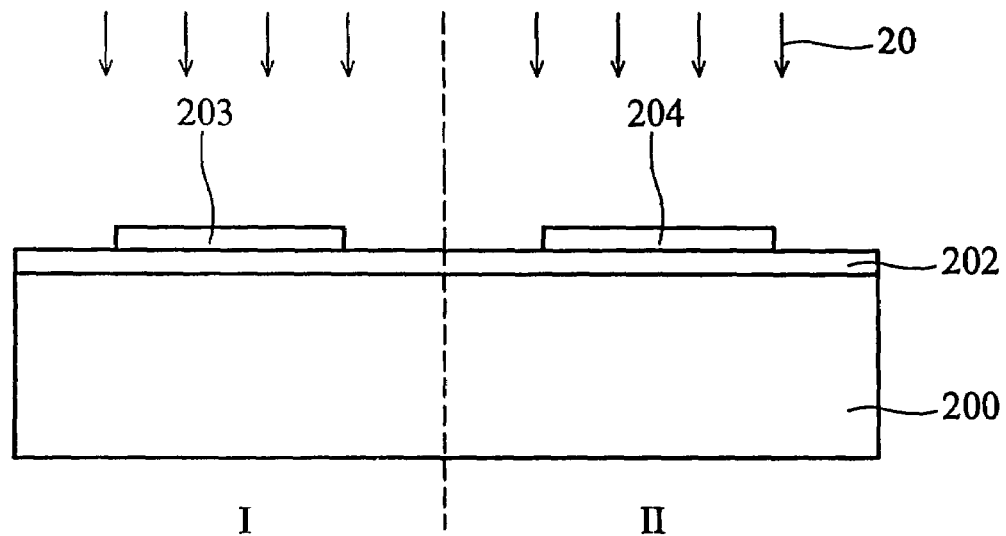
FIGS. 2A to 2F are sectional views illustrating an embodiment of a method for fabricating a TFT structure in a display panel in accordance with the present invention.
Figure 2B:
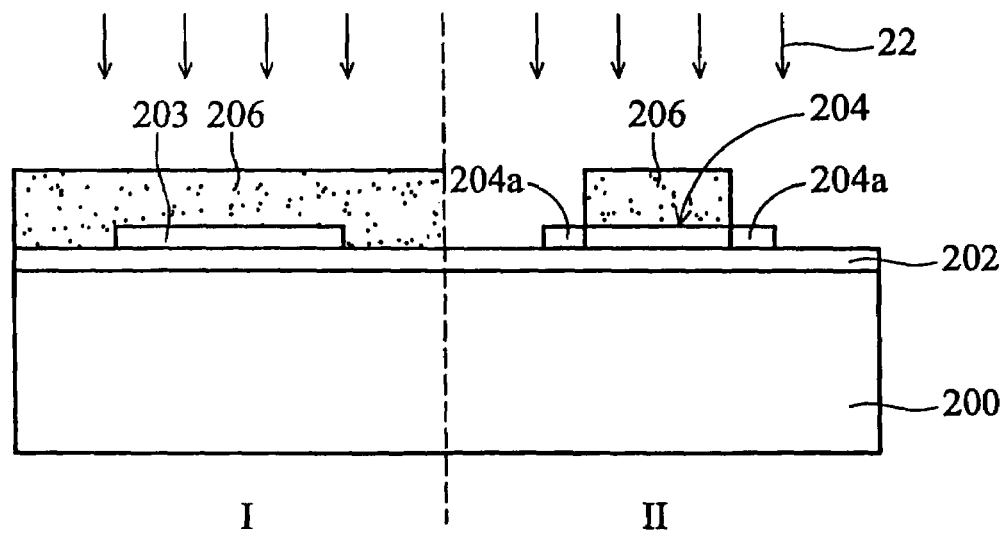
Figure 2C:
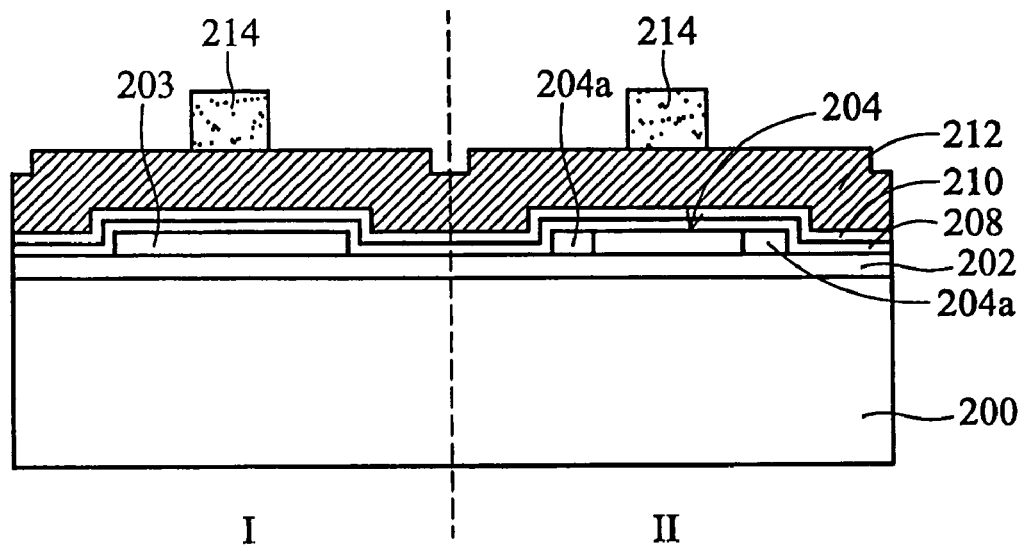
Figure 2D:
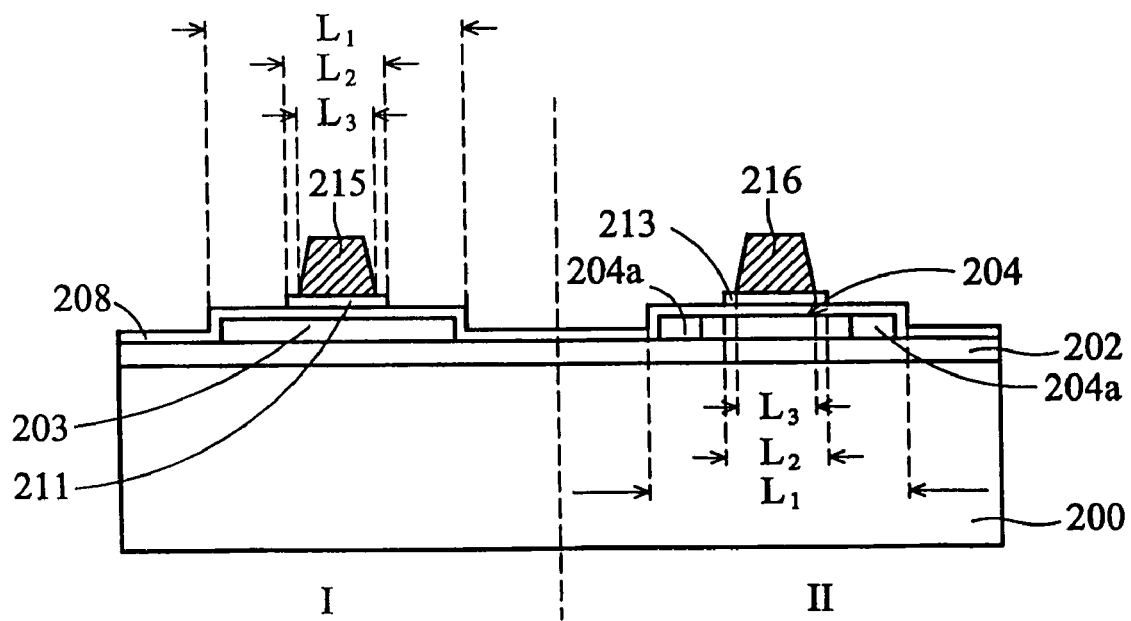
Figure 2E:
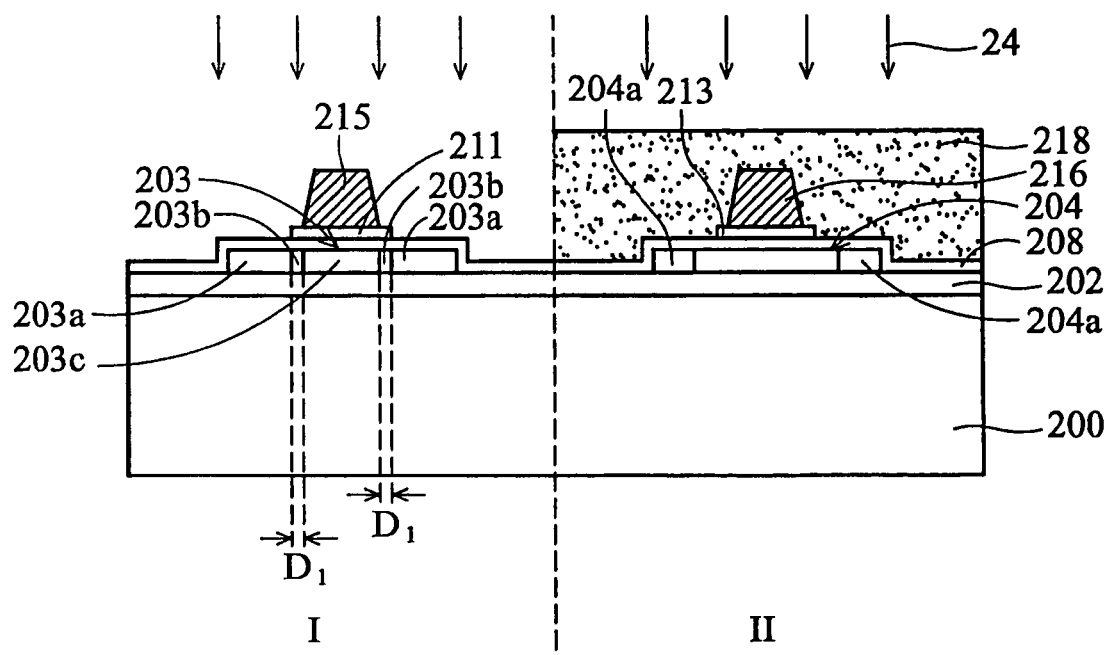
Figure 2F:
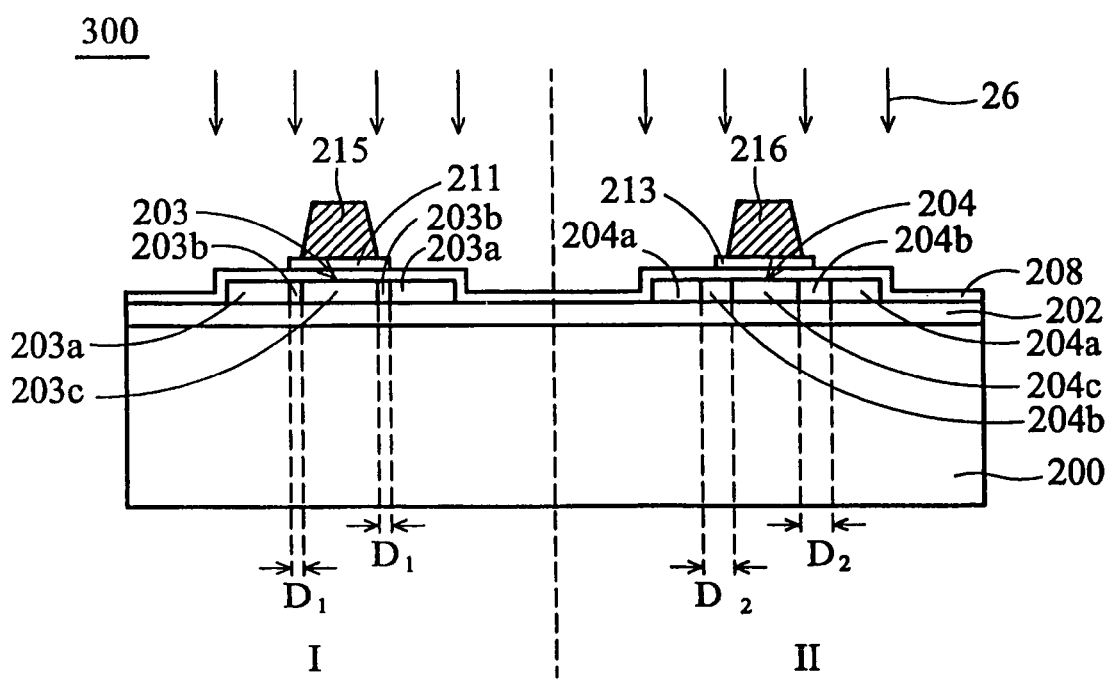

Referring to FIGS. 2A to 2F, which illustrate an embodiment of a method for fabricating a system for displaying images incorporating a thin film transistor device 300. In FIG. 2A, a substrate 200 comprising a driving circuit region I and a pixel region II is provided. The substrate 200 may comprise glass, quartz, or plastic. A buffer layer 202 may be optionally formed on the substrate 200 to serve as an adhesion layer or a contamination barrier layer between the substrate 200 and the subsequent layer formed thereon. The buffer layer 202 may be a single layer or multiple layers. For example, the buffer layer 202 may comprise silicon oxide, silicon nitride, or a combination thereof. In this embodiment, the buffer layer 202 comprises a silicon nitride layer with a thickness of about 500 Å and an overlying silicon oxide layer with a thickness of about 1300 Å. In order to simplify the diagram, only a single layer is depicted.

A first active layer 203 is formed on the substrate 200 in the driving circuit region I and a second active layer 204 is formed on the substrate 200 in the pixel region II. The first and second active layers 203 and 204 may be formed simultaneously using concurrent deposition, masking and etching processes. In this embodiment, the first and second active layers 203 and 204 may comprise polysilicon and may be formed by conventional low temperature polysilicon (LTPS) technology. For example, an amorphous silicon layer (not shown) is formed on the substrate 200. A laser annealing treatment, such as an excimer laser annealing (ELA) treatment, is performed, such that the amorphous silicon layer transform to polysilicon layer. The polysilicon layer is subsequently patterned to respectively form polysilicon pattern layers 203 and 204 in the driving circuit region I and in the pixel region II. The polysilicon pattern layers 203 and 204 serve as first and second active layers for thin film transistors in the driving circuit region I and in the pixel region II, respectively. Next, a channel doping process is performed in the first and second active layers 203 and 204. For example, boron ion implantation 20 is performed in the first and second active layers 203 and 204.

In FIG. 2B, a masking layer 206 is formed on the substrate 200 to cover the first active layer 203 and a portion of the second active layer 204. Particularly, the exposed portion of the second active layer 204 is used for definition of a source/drain region. The masking layer 206 may be formed by conventional lithography. Heavy-ion implantation 22 is subsequently performed in the uncovered second active layer 204 to form a source/drain region 204a therein. For example, the heavy-ion implantation 22 is performed with a dose of $1 \times 10^{14} \sim 1 \times 10^{15}$ atom/cm$^2$.

After removal of the masking layer 206, a first insulating layer 208, a second insulating layer 210 and a conductive layer 212 are successively formed on the first and second active layers 203 and 204 and the buffer layer 202, as shown in FIG. 2C. In this embodiment, the first insulating layer 208 may comprise silicon oxide and the second insulating layer may comprise silicon nitride. The first and second insulating layers 208 and 210 can be formed by conventional deposition, such as chemical vapor deposition (CVD). The conductive layer 212 may comprise metal, such as molybdenum (Mo) or Mo alloy. The conductive layer 212 can be formed by CVD or sputtering. A masking pattern layer 214 is formed on the conductive layer 212 to cover the gate pattern regions in the driving circuit and pixel regions I and II, respectively, as shown in FIG. 2C.

The conductive layer 212 and the underlying second insulating layer 210 are successively etched using the masking pattern layer 214 as an etch mask. The unetched first insulating layer 208 serves as a first gate dielectric layer. Moreover, after etching, gate layers 215 and 216 and second gate dielectric layers 211 and 213 are formed in the driving circuit and pixel regions I and II, respectively. Thereafter, the masking pattern layer 214 (as shown in FIG. 2C) is removed, as shown in FIG. 2D. In this embodiment, for example, the etching step may involve dry etching, which may comprise plasma etching or reactive ion etching (RIE) using the mixture of oxygen-containing gas and chlorine-containing gas as a process gas. During etching of the second insulating layer 210, flows of oxygen-containing gas and chlorine-containing gas may be adjusted to laterally remove a portion of the gate layers 215 and 216, such that the length $L_2$ of the second gate dielectric layer 211 and 213 is longer than the gate length $L_3$ of the gate layers 215 and 216. The gate dielectric layers 211 and 213 respectively extend beyond the gate layers 215 and 216. For example, during etching of the gate layers 215 and 216, the flow of the chlorine-containing gas is gradually tuned to reach a maximum, even if chlorine-containing gas is the only gas used. During etching of the second insulating layer 210, the flow of the oxygen-containing gas is gradually increased to reach a maximum, thus a portion of the masking layer 214 is removed and the gate layers 215 and 216 are again exposed by the simultaneously etched masking layer 214. Moreover, the unetched first dielectric layer 208 has a length $L_1$ above the active layers 203 and 204, which is longer than the length $L_2$ of the second gate layer dielectric layer 211 and 213.

In FIG. 2E, a masking layer 218 is formed in the pixel region II to cover the gate layer 216, the second gate dielectric layer 213 and the first gate dielectric layer 208. That is, the masking layer 218 requires covering of the region in the second active layer 204 without being doped by ion implantation 24 (as shown in FIG. 2E). The masking layer 218 may be formed by conventional lithography. Heavy-ion implantation 24 is subsequently performed in the first active layer 203 to form a source/drain region 203a and a lightly doped region 203b therein. For example, the heavy-ion implantation 24 is performed with a dose of $1 \times 10^{14} \sim 1 \times 10^{15}$ atom/cm$^2$. In this embodiment, the lightly doped region 203b is self-aligned to the gate layer 215. Accordingly, the reliability of the TFT in the driving circuit region I can be increased. Additionally, the length $D_1$ of the lightly doped region 203b can be determined by the difference between the length $L_2$ of the second gate dielectric layer 211 and the gate length $L_3$ of the gate layer 215. That is, the electron mobility of the TFT in the driving circuit region I can be further increased by reducing the difference between the lengths $L_2$ and $L_3$. In the first active layer 203, a region under the gate layer 215 serves as a channel region.

Figure 3:
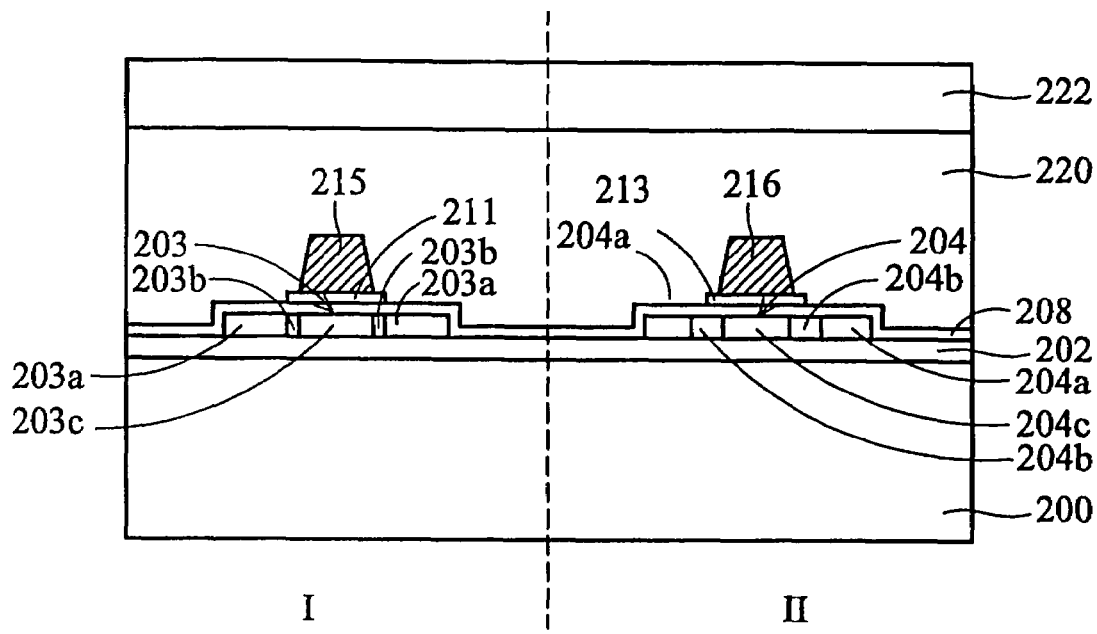
FIG. 3 is a sectional view of an embodiment of a flat panel display device that incorporates the TFT device in accordance with one embodiment of the present invention.

After the masking layer 218 is removed, light-ion implantation 26 is performed in the second active layer 204 to form a lightly doped region 204b therein, as shown in FIG. 2F. For example, the light-ion implantation 22 is performed with a dose of $1 \times 10^{13} \sim 1 \times 10^{14}$ atom/cm$^2$. FIG. 3 shows some of the additional components making up the system for displaying images, including a liquid crystal layer 220, an upper substrate 222, and various optical layers (not shown). As a result, the system for displaying images incorporating the TFT device 300 of the invention is complete. In this embodiment, the lightly doped region 204b is partially covered by the second gate dielectric layer 213. That is, the lightly doped region 204b in the second active layer 204 has a length $D_2$ different from the length $D_1$ of the lightly doped region 203b in the first active layer 203. Particularly, the length $D_1$ is shorter than the length $D_2$. The LDD region 204b with a longer length $D_2$ reduces leakage in the TFT in the pixel region II. In the second active layer 204, a region under the gate layer 216 serves as a channel region.

According to the invention, since the TFTs in the driving circuit and pixel regions I and II have LDD regions 203b and 204b with different lengths $D_1$ and $D_2$, the TFT device can have different electrical characteristics in driving circuit and pixel regions I and II. Particularly, since the length $D_1$ is shorter than the length $D_2$, the TFT in the driving region I has high electron mobility (fast response) while keeping leakage in the TFT in the pixel region II low.

Figure 5:
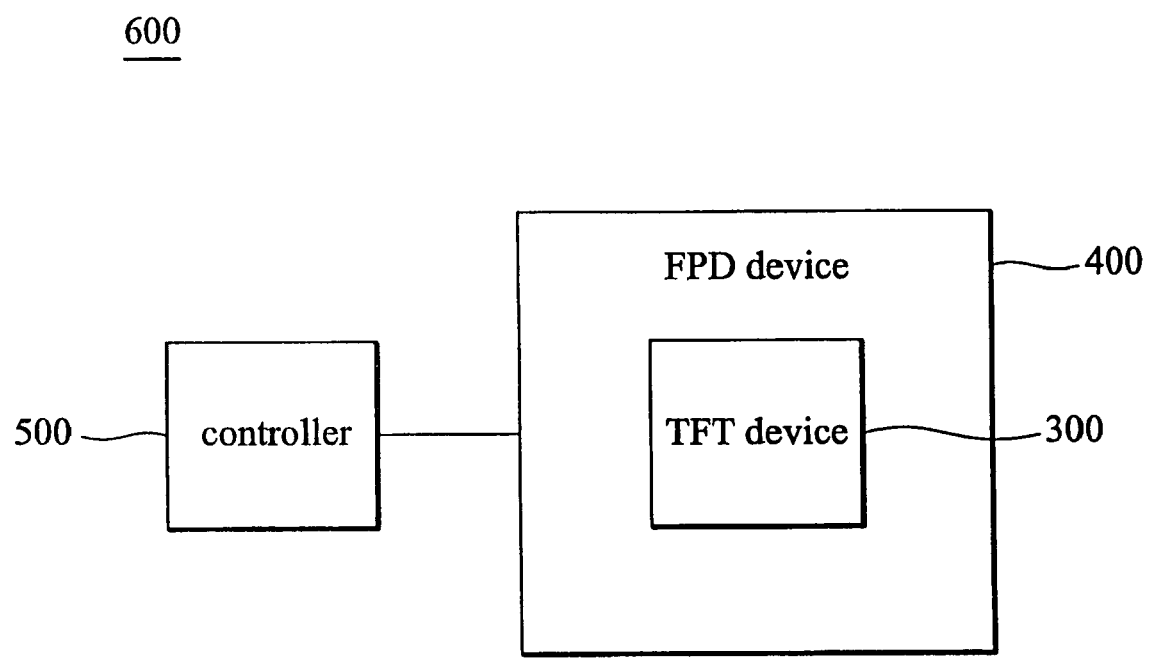
FIG. 5 is a schematic representation of an electronic device that incorporates the system for displaying images in accordance with one embodiment of the present invention.

FIG. 5 schematically shows an embodiment of an electronic device 600 that incorporates a system for displaying images (e.g., a flat panel display device 400) in accordance with the present invention. The electronic device 600 may be a laptop computer, a mobile phone, a digital camera, a personal digital assistant (PDA), a desktop computer, a television, a car display or a portable DVD player. The described thin film transistor device can be incorporated into the flat panel display (FPD) device 400, which may be an LCD or OLED panel. As shown in FIG. 5, the flat panel display device 400 may comprise a plurality of thin film transistor devices, such as the thin film transistor device 300 shown in FIG. 2F. As shown in FIG. 5, the electronic device 600 comprises the FPD device 400 and a controller 500, which may include, for example, control circuit and an input unit. The controller 500 is operatively coupled to the flat panel display device 400, provides input signals (e.g. image signals) to the FPD device 400 to generate images, and may include control functions controlling the operation of the FPD device 400.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   a thin film transistor device, comprising:
   a substrate comprising a driving circuit region and a pixel region;
   first and second active layers disposed on the substrate in the driving circuit region and in the pixel region, respectively, wherein each of the first and second active layers comprises a channel region, a source/drain region and a lightly doped region formed therebetween, wherein combined length of the channel region and the lightly doped region of the first active layer is different from combined length of the channel region and the lightly doped region of the second active layer; and
   two gate structures disposed on the first and second active layers, respectively, wherein each gate structure comprises a stacked first and second gate dielectric layers and a gate layer having a gate length, and the second gate dielectric layer has a length shorter than that of the first gate dielectric layer but longer than the gate length of the gate layer;
   wherein the lightly doped region of the first active layer has a length different from that of the second active layer.

2. The system as claimed in claim 1, wherein the lightly doped region of the first active layer has a length shorter than that of the second active layer.

3. The system as claimed in claim 1, wherein the first and second active layers comprise low temperature polysilicon.

4. The system as claimed in claim 1, wherein the gate layer comprises molybdenum.

5. The system as claimed in claim 1, wherein the first gate dielectric layer comprises silicon oxide.

6. The system as claimed in claim 5, wherein the second gate dielectric layer comprises silicon nitride.

7. The system as claimed in claim 1, further comprising a buffer layer disposed between the substrate and the first and second thin film transistors.

8. The system as claimed in claim 1, further comprising a display element defined in the pixel region, which is operatively coupled to the thin film transistor device.

9. The system as claimed in claim 8, wherein the system comprises a flat panel display device.

10. The system as claimed in claim 9, further comprising:
    a controller operatively coupled to the flat panel display device to control the operation of the flat panel display device to render the image in accordance with an image data.

11. The system as claimed in claim 9, wherein the system is at least one of a laptop computer, a mobile phone, a digital camera, a personal digital assistant, a desktop computer, a television, a car display and a portable DVD player.

12. The system as claimed in claim 1, wherein the channel region of the first active layer and the channel region of the second active region have substantially same length.

13. The system as claimed in claim 1, wherein the gate layer of the gate structure disposed on the first active layer and the gate layer of the gate structure disposed on the second active layer have substantially same length.

14. The system as claimed in claim 1, wherein for the first gate structure, the first gate dielectric layer extends beyond the gate layer and partially covers the first active layer to define a first lightly doped region, and wherein for the second gate structure, the first gate dielectric layer extends beyond the second gate layer and partially covers the second active layer.

15. The system as claimed in claim 14, wherein the second gate dielectric layer extends beyond the first gate in the first gate structure and the second gate dielectric layer extends beyond the second gate in the second gate structure by substantially same length.

16. The system as claimed in claim 15, wherein the channel region of the first active layer and the channel region of the second active region have substantially same length.

17. The system as claimed in claim 15, wherein the gate layer of the gate structure disposed on the first active layer and the gate layer of the gate structure disposed on the second active layer have substantially same length.

* * * * *